United States Patent [19]

Langhans et al.

[11] Patent Number: 4,792,658
[45] Date of Patent: Dec. 20, 1988

[54] DEVICE FOR SOLDERING ELECTRONIC STRUCTURAL ELEMENTS OF A CIRCUIT PLATE BAR

[75] Inventors: Lutz Langhans, Starnberg; Friedrich Meyer, Berg; Johannes Drake, Paderborn, all of Fed. Rep. of Germany

[73] Assignee: Nixdorf Computer AG, Fed. Rep. of Germany

[21] Appl. No.: 930,139

[22] Filed: Nov. 12, 1986

[30] Foreign Application Priority Data

Nov. 11, 1985 [DE] Fed. Rep. of Germany ....... 3539933

[51] Int. Cl.[4] .............................................. B23K 26/00
[52] U.S. Cl. ......................... 219/121.63; 219/121 LQ; 219/121 LT; 219/85 BA
[58] Field of Search ................. 219/121 LC, 121 LD, 219/121 LS, 121 LT, 121 LE, 121 LF, 121 LQ, 85 BA, 85 BM

[56] References Cited

U.S. PATENT DOCUMENTS 3,230,475  1/1966  Koester et al. ............... 219/121 LT
3,534,462  10/1970  Cruickshank et al. ..... 219/121 LT X
3,934,073  1/1976  Ardezzone ............... 219/121 LT X
4,327,277  4/1982  Daly ........................ 219/121 LT X

FOREIGN PATENT DOCUMENTS 2624121  12/1977  Fed. Rep. of Germany .
2934407  3/1980  Fed. Rep. of Germany .
0173095  10/1983  Japan .

Primary Examiner—C. L. Albritton
Attorney, Agent, or Firm—Varnum, Riddering, Schmidt & Howlett

[57] ABSTRACT

A device for a simultaneous soldering of at least two connecting elements (52) of an electronic structural element (54) on a circuit plate bar (50) comprises a workpiece support (44) and a laser (10) for producing the soldering energy, and has arranged two soldering beams (20) of at least approximately equal intensity, having in their path, at any time, an optic (30) for focusing the soldering beams (20) on the soldering spots. The resonator of the laser (10) is closed on both of its londitudinal sides by a semi-reflecting mirror (12) for production of a relative movement between the soldering beams (20) and the workpiece support (44), there is, at any time, a deflecting device provided, having two by a control device (48) independently adjustable mirrors (38, 40) for an operative deflection of the respective soldering beam (20).

7 Claims, 2 Drawing Sheets

DEVICE FOR SOLDERING ELECTRONIC STRUCTURAL ELEMENTS OF A CIRCUIT PLATE BAR

DESCRIPTION

1. Technical Field

The invention relates to a device for soldering simultaneously at least two terminal connecting units of an electronic structural element on a circuit plate bar, comprising a workpiece support and a laser for producing soldering energy and for providing two soldering beams of at least approximately equal intensity having always in their path an optic for focusing and aligning the soldering beams upon the soldered spots, and means for producing a relative movement between the soldering beams and the workpiece support.

2. Background Art

The soldering of electronic structural elements on circuit plate bars with the help of a laser beam has the advantage that by the sharp focused laser beam only the soldered spot is heated, so that a global heating-up of the circuit bar plate and/or the individual structural elements, and thereby a potential endangering of them by overheating, can be avoided. Therefore, the laser soldering process would be especially suitable for the attachment of electronic structural elements according to the SMD (Surface Mounted Device) techniques. There is also the further possibility to reach by the sharply focused laser beam the not easily accessible soldering spots. With the heretofore known laser soldering process, in which the soldered spots are subsequently swept over by a laser beam, the mounting of the circuit plate bars by structural elements that are provided with a great number of small legs (pins) takes a considerably long time. It has already been endeavored to prevent this disadvantage by working simultaneously with several laser or soldering beams. The beam emerging then from a laser is divided into several individual beams as, for example in this case, of the German disclosed patent application No. 29 34 407, for a device of the initially mentioned art.

However, in practice is has been demonstrated that it is almost impossible or it requires a great technical outlay to obtain an even approximately precise division of energy for the different part beams. However, the soldering beams must be of an equal intensity, since otherwise the structural elements or the circuit bar will burn under one soldering beam, while the intensity of the other soldering beam would not suffice under certain circumstances for providing a satisfactory soldered connection (bond). However, it would be too expensive to use for every soldering beam its own laser. On the other hand, the individual beams are firmly aligned, so that the device must be readjusted after a transition to structural elements of another size or with other distances of the small legs (pins). Therefore, this arrangement is not sufficiently flexible for practical application.

SUMMARY OF THE INVENTION

The invention has the task to provide a mechanism of the initially mentioned type in which an increased power is obtained at a comparatively low cost so that the laser soldering process can be applied for a mass of circuit plate bars with electronic structural elements.

This task is solved according to the invention in that the resonator of the laser for the production of both soldering beams is closed on both of it longitudinal ends, each by one partly semi-reflecting mirror. For producing relative movement and for aligning the soldering beams there is provided a deflecting device that has two independently adjustable mirrors for operatively deflecting the respective soldering beam.

In the solution according to the invention, two partial beams of equal intensity are produced in a simple manner by a single laser, so that it is possible to solder with them simultaneously. In contrast to the device known from the German disclosed patent application No. 29 34 407, in the solution according to the invention, instead of the structural element relative to the firmly adjusted soldering beams being movable, those elements relative to the structural element are movable. Therefore, a structural element with at least two rows of connecting elements can be soldered in a fraction of the time heretofore needed for this operation.

The deflecting devices are preferably arranged on both sides of a workpiece support, placed diametrically opposite so that the soldering beams are directed in their resting (inoperative) position obliquely to the workpiece support and at an angle to one another. This arrangement also enables one to solder structural elements according to the SMD techniques in which the legs do not laterally project from the base of the structural element, and the soldered spots thus cannot be reached at all in case of a vertical alignment of the soldering beam relative to the surface of the workpiece support.

With the continuing progression of miniaturization of integrated circuits, more structural elements occur which are provided with contact legs not only on two opposite sides but also on all four sides. In order to be able to work in this case fast and rationally with two soldering beams only, the deflecting devices, according to one especially preferred form of embodiment of the invention, are arranged so that both soldering beams can lie in their respective inoperative positions, at any given time, vertical to the surface of the workpiece support and oblique to the direction of the plane of advance of the workpiece. This results in the usually rectangular (parallelipipedic) aligned structural elements, with their edges parallel to the edges of the circuit plate bars, being able to lie approximately diagonally between both soldering beams. With the soldering beams directed in their respective resting (inoperative) positions, at any given time, proximate to a corner of the respective structural element, each soldering beam, starting from this resting position, can then sweep over both rows of small legs, meeting in the respective corner and directed rectangularly to one another, without the need of a readjustment of the workpiece or of the deflecting devices. Such a readjustment would require a considerable length of time.

A further shortening of the time of soldering and thus an increase of productivity can be obtained by increasing the power of the soldering beam. However, this is not easily obtainable, since this would create the danger that the soldering beam burns the connections of the structural element or the plate bar. According to the invention, the elimination of this difficulty is suggested by controlling the mirrors so that the impact (impinging) point of the laser beam performs on the workpiece, within the area of a soldering spot, a rapid pendulum (reciprocating) movement in comparison to its dwelling time within the area of the soldering spot, and also performs the rapid pendulum movement during its movement along a predetermined path, in comparison with its speed of movement along the path. This enables one to increase considerably the power of the soldering beam without the danger of burning the connections or the plate bar. This permits a significant increase of the soldering speed. The control of the mirrors in a sense that the soldering beam executes the desired pendulum movement can be obtained in various ways. The control program that determines the movement of the mirrors can be set correspondingly.

In order to enable one to apply the laser soldering process for mounting a mass of plate bars, it is necessary to have an automatic and exact advance of the workpiece executed by the soldering mechanism. During soldering of the connecting units of a structural element, the workpiece remains at rest in the operation according to the invention, since the soldering beams are led by the deflecting mirrors along the respective row of small legs of the structural element, while the soldering beam is not switched off during the passage from one small leg to the next leg.

However, an advance of the workpiece follows during the passage from one structural element to the next structural element and the soldering beam is interrupted during this adjustment. Here, the workpiece support is adjustable in its advance in a known manner by means of an actuating drive, in parallel to the surface of the workpiece support. The positioning of the structural elements in their respective soldering position, and the deflection of the soldering beams is realized by a control device with the help of a control program, so that the positioning of the structural elements and the deflection coordinates necessary for the soldering beams are obtained in the manner described according to the invention so that by adjusting the circuit plate bar of each structural element it is brought into its soldering position and computed and stored for the coordinates corresponding to this position. The individual soldering spots of the respective structural element in its soldering position will be scanned by the laser beam that has been weakened by a dimming device and manually stepped up, and the coordinates of the position of the mirrors are computed and stored in correspondence to the respective position of the laser beam for each soldering position. Should a great number of circuit plate bars of the same type be processed, the coordinates of the structural elements and of their soldering positions are computed in the above described manner. Since the assembly of the circuit plate bar with the structural elements and their positioning relative to the deflecting mechanisms of the soldering device can be produced with a sufficiently high precision and reproducibility, the processing of the further circuit plate bars, according to the now already available coordinates, can be automatically executed. Any desired arrangement of structural elements on a circuit plate bar can thus be exactly stored. This process for computing and storing coordinates for processing a workpiece by means of a deflectable laser beam is not limited to the application in connection with the above described soldering process, but it is also universally applicable.

The most sensitive elements of the described laser soldering device are the mirror galvanometers used for deflecting the soldering beams. Similar galvanometers are slightly different from one to another and in addition suffer under certain circumstances a zero point drifting, when switched on and off. Therefore, it is necessary to have a possibility of checking the actual position of the soldering spots on the workpiece so as to adjust the galvanometers and eventually also compute a scaling factor for the coordinates of the soldering spots. For this purpose it is suggested, according to the invention, that at least one reference mark is scanned in a predetermined position on the circuit plate bar by the weakened soldering beam, and the actual position of the mirrors corresponding to the impact of the soldering beam on the reference mark is compared with a desired index position of the same. In case of deflections between actual and desired positions, a corresponding readjustment of the galvanometer and/or a zero point corrector for the control data corresponding to the coordinates of the soldering position are executed. By scanning several reference marks, it is also possible to eventually compute a scaling factor. This provides the possibility of not only readjusting the galvanometers in a relatively simple manner after interruption of the operation on the same device but also to work with the same operational program on various soldering devices having galvanometers which are slightly different.

BRIEF DESCRIPTION OF THE DRAWINGS

Further features and advantages result from the following description which explains the invention on the basis of an example embodiment in connection with the attached drawings, in which.

DETAILED DESCRIPTION

Figure 1:
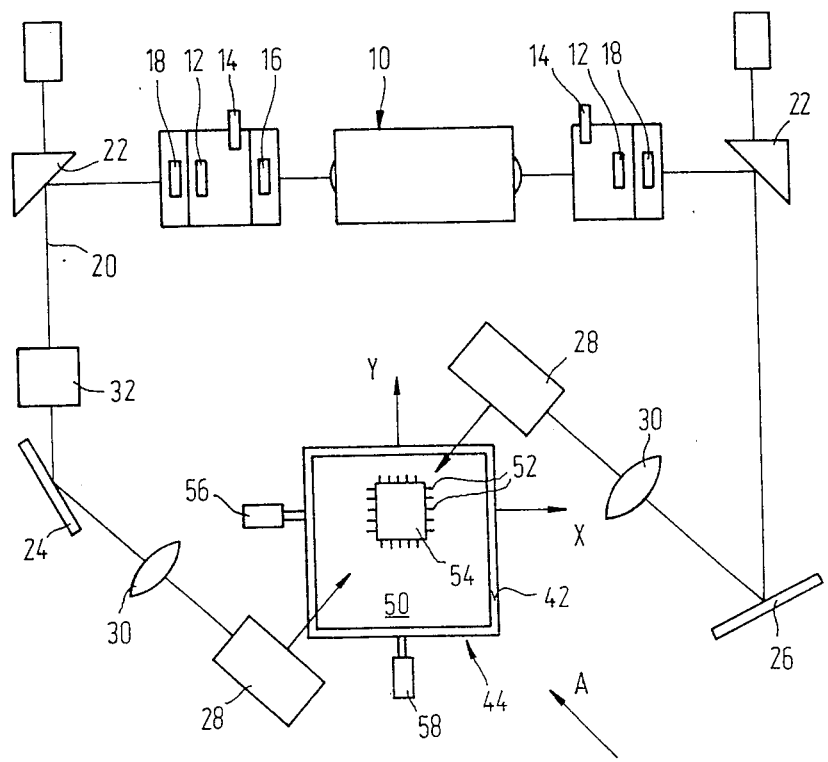
FIG. 1 is a schematic top view of a soldering device, according to the invention.

In FIG. 1 a laser is designated by 10 which, for example, can be a YAG-laser. The resonator of the laser 10 is closed on both ends by schematically indicated semi-reflecting mirrors 12 which permit emergence of about 10% of the energy. Within the resonator there is a drop lock 14 provided in front of each mirror 12 which shifts automatically into the path of the beams during a failure and thus prevents the emerging of energy from the laser. Equally, within the path of the resonator is placed a mechanical switch 16 by which the building-up of the laser energy can be interrupted, i.e. the laser can be completely switched off.

Beside the resonator path, a switch 18 is connected to each mirror 12, by which switch the respective partial beam or soldering beam 20 can be separately interrupted. Each switch 18 is designed so that at any given time it can intercept the energy emerging from the respective mirror 12. One of the part beams 20 is then deflected by one of the mirrors 22 and the mirror 24, while the other of beams 20 is deflected by the other mirror 22 and the mirror 26, with each beam 20 being deflected to a corresponding one of the deflecting devices 28. The precise number and arrangement of the mirrors are dependent on the particular geometry of the entire system. Further, in the path of each beam is arranged, at any given time, an optic schematically indicated by a lens 30 for an eventual adaptation of the focus and for setting the sharpness of its depth. Furthermore, in the path of one of the beams there is a beam control system 32 arranged on the left side of FIG. 1, in order to enable exact tuning of the intensity of both part beams 20.

Figure 2:
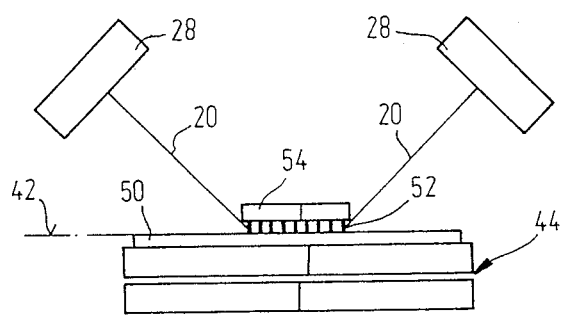
FIG. 2 is a schematic side view of the workpiece support with the deflecting devices in the direction of the arrows A in FIG. 1.
Figure 3:
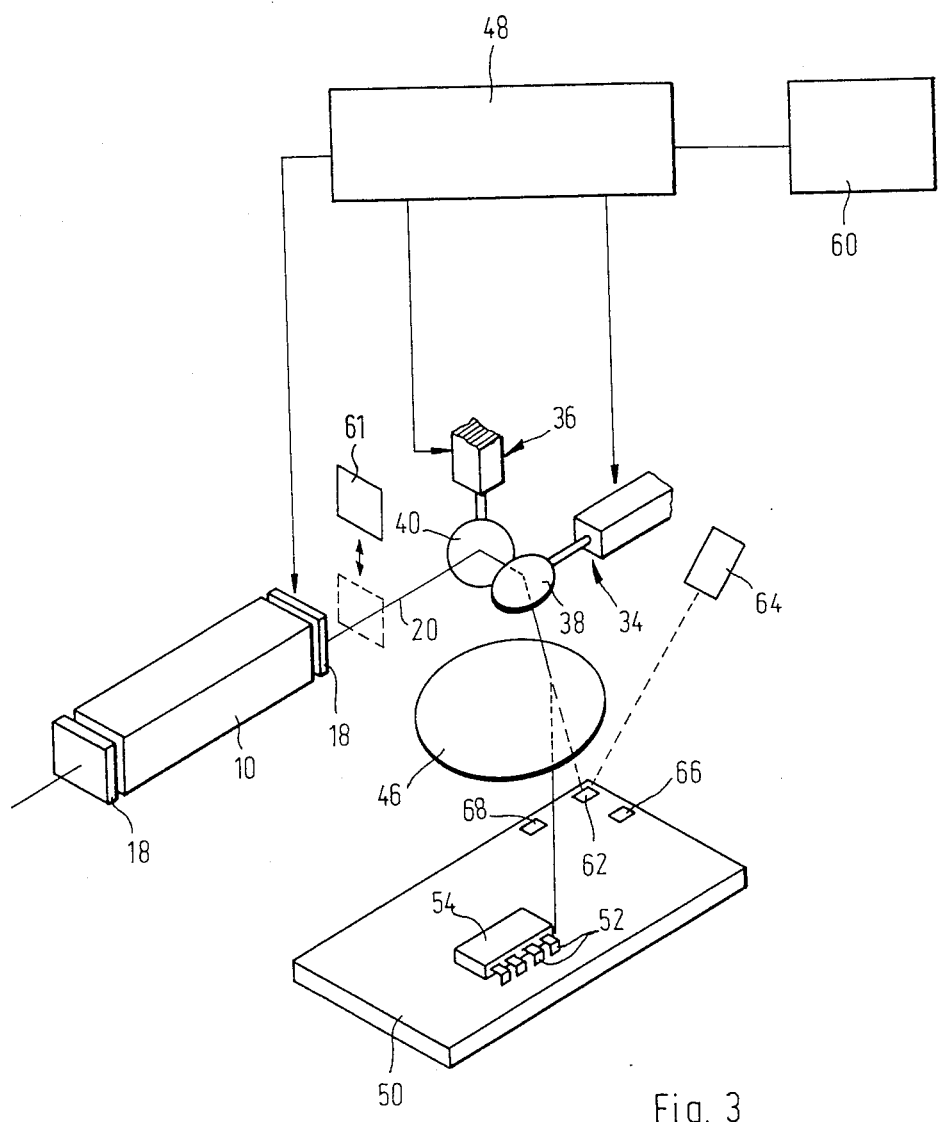
FIG. 3 is a schematic sketch for explaining the method of operation of the deflecting devices.

As shown in FIG. 3, each of the deflecting devices 28 comprises two galvanometers 34 and 36 respectively associated with the mirrors 38, 40, which can be utilized to deflect the corresponding partial beam in any desired direction. The field that is swept over by the beam in this operation on the surface 42 of a workpiece support table 44 (shown in FIG. 2), depends, among other factors, also on the selected objective (lens) 46 at the exit of each of the deflecting devices 28.

The galvanometers 34 and 36 are controlled by a control device 48, in order to determine the direction and length of the deflection of the soldering beam 20 on the surface of the workpiece. The control is performed, for example, by means of a suitable control program so that the respective soldering beam executes a fast, preferably irregular pendulum (reciprocating) movement of a slight amplitude. Consequently, the point of impact of the soldering beam moves on a circuit plate bar 50 within the area of a soldering spot and on the path of movement leading from one soldering path to the other according to a determined or random pattern of movement. The power of the soldering beam can thus be increased without having to fear that the legs (pins) 52, a structural element 54, or a circuit plate bar 50 is burned. The control device 48 further controls the drives 56 and 58 (FIG. 1) of the workpiece support table 44 to adjust the table 44 in the X and Y directions, respectively, as well as controlling the switches 18 by which the individual welding beams 20 can be switched off. With the help of the deflecting devices 28, it is thus possible to lead both part- or complete soldering beams along the small legs 52 of a structural element 54 that is placed on the circuit plate bar 50, lying on the workpiece support table 44. The respective welding beam 20 is not switched off during the transition from one small leg 52 to the next one, but only at the end of a row of legs.

As shown in FIG. 2, the deflecting devices 28 are arranged relative to the workpiece support table 44 so that the welding beams 20 are directed obliquely to the surface 42 of the workpiece support table 44 and at an angle to each other. This creates the possibility to also solder structural elements on circuit plate bars where the legs of the structural elements do not project laterally from the base of the structural elements, as in the case represented in FIG. 2.

FIG. 1 represents an arrangement in which the deflecting devices 28 are arranged relative to the structural element 54 to be soldered on bar 50 so that the welding beams 20 lie in their inoperative positions, directed vertically to the surface 42 of the workpiece support table 44 and directed vertically and diagonally to the plane proceeding through the structural element 54. For a structural element that has a row of small legs on all four sides, as in the case illustrated in FIG. 1, this offers the possibility to start from one corner of the structural element 54 and to use one soldering beam 20 to sweeep over and thus solder two mutually orthogonal proceeding rows of legs 52. An adjustment of the same structural element 54, relative to the deflecting devices 28, is not required. A readjustment of the circuit plate bar 50 relative to the deflecting devices 28 is made only during the transition from one structural element to the following one.

For automating the soldering operation, it is necessary to feed into the control device 48 the corresponding coordinates of the structural elements 54 relative to the deflecting devices 28 and the magnitudes of control for the mirrors in order to lead the soldering beams 20 on the respective structural element from one soldering spot to another. This happens so that, after a positioning of the circuit plate bar 50 on the workpiece support table 44, the table 44 will be adjusted with the use of its drives 56 and 58 so that the structural element present at that time is in a suitable soldering position relative to the deflecting devices 28. The coordinates of the workpiece support table 44 corresponding to this position are fed-in by means of an operating device 60 of the control device 48 and are stored in it. The soldering spots belonging to the structural element 54 are scanned with the structural element at rest and with the use of the respective laser beam 20, the intensity of which can be reduced so far by a schematically indicated adjustable dimming device 61 which can be selectively positioned in the path of the respective beam so that the power of the beams is not sufficient for soldering nor is it causing a danger of burning the material. It is advantageous in practice to arrange the dimming device 61 within the resonator of the laser 10 in order to avoid dimming errors of the beam 20 by optical elements of the dimming device. Even though the beam of the laser used in the present case is not visible by the eye, its point of impact on the workpiece 50 can still be made visible with the help of a suitable camera (not illustrated). The weakened laser beam is not manually advanced with the help of the operating device 60 and of the control device 48 from one soldering spot to another. The corresponding positions of the galvanometer mirrors 38 and 40 and the respective control data corresponding to these positions which relate to the impact of the weakened laser beam on the respective soldering spot, are stored in a suitable storage of the control device 48. As soon as all coordinates and control magnitudes for a certain circuit plate bar 50 are thus determined, the soldering of the structural elements 54 on the same type of circuit plate bars can be automatically performed.

In devices which use a laser of a high power, it is known to blend-in, coaxially to the working beam, a pilot beam for adjusting the optical components. By doing this, it is not always quite possible to eliminate small deviations between the pilot beam and the working beam. This possible source of error can be completely eliminated by the application of a working or original beam weakened in its intensity for scanning the soldering spots in the present operation.

For soldering spots and distances between soldering spots of small measurements, a high precision is necessary in the control of the soldering beams. Small deviations must be completely eliminated in the individual structural elements, as well as in the assembly of the plate bars. Neither the galvanometers 34 and 36, nor other galvanometers even of the same design, behave fully identically. Furthermore, the zero point of the galvanometer may need adjustment when it is switched on after a long operational interruption. It is therefore advantageous, if there is a chance, to compare, on the one hand, the stored coordinates of the soldering spots with the actual coordinates on the respective workpiece and, on the other hand, to readjust the galvanometers relative to the predetermined initial position of the circuit plate bar on the workpiece supporting table and, eventually, to compute a scale factor so that the same control program with the same values of coordinates and control magnitudes can be applied on different soldering devices of the same type.

For this purpose, and as shown in FIG. 3, the weakened soldering beam is directed to a first reference mark 62 which is placed on a certain point of the plate bar 50 positioned on the workpiece support table 44. It can be foreseen that the soldering beam finds automatically in this operation the reference mark 62. The impact of the soldering beam on the reference mark 62 is registered by a receiver 64. A comparator in the control mechanism 48 compares the corresponding actual position of the galvanometer mirrors 38 and 40 with their desired (index) position corresponding to the position of the reference mark 62. In case of a deflection, the galvanometers 34 and 36 can be correspondingly readjusted. A computing of a suitable scale factor can follow by scanning further reference marks 66 and 68 by a similar method. It is also possible to automatically guide the soldering beams 20 along the soldering spots so that beams reflected on the connected elements are intercepted. Receiver elements corresponding to the receiver 64 can be utilized, and can be arranged so that radiation reflected from the scanned areas is continuously intercepted. The position of the deflecting devices, during reception of a reflected beam, is compared with control data stored for the respective soldering position so that it can eventually be corrected.

The above described device and the respective pertinent operational steps were described in connection with soldering an electronic structural element on a circuit plate bar. The same operational steps and the same device can also be applied in other cases in which a processing of workpieces can be produced with the help of a deflectable laser beam. The specific abovedescribed illustrative embodiment is not meant to be an exhaustive enumeration of the elements and methods which can be utilized in accordance with the invention. Accordingly, it will be apparent to those skilled in the pertinent art that modifications and variations of the above-described illustrative embodiment of the invention can be effected without departing from the spirit and scope of the novel concepts of the invention.

The embodiments of the invention in which an exclusive property or privilege is claimed are defined as follows:

1. A device for soldering simultaneously at least two connecting elements of an electronic structural element on a circuit plate bar comprising a workpiece support, a laser for producing the soldering energy, at least two soldering beams provided with at least approximately equal intensity, in the path of which is arranged at any given time an optic for focusing and aligning the soldering beams on the soldering spots, and means for the production of a relative movement between the soldering beams and a workpiece support, characterized in that the device further comprises a pair of semi-reflecting mirrors (12) for closing both longitudinal ends of a resonator of the laser (10) utilized for producing both soldering beams (20), a control device (48), and the means for production of the relative movement between the soldering beams and the workpiece support comprises a deflecting device (28) having at least two independently adjustable mirrors (38, 40), wherein the control device (48) controls adjustment of the independently adjustable mirrors (38, 40) so as to provide operational deflection of the respective soldering beams (20).

2. A device according to claim 1, characterized in that the deflecting devices (28) are arranged on both sides of the workpiece support (44) and placed diametrically opposite so that the soldering beams (20) are directed in their resting position obliquely to the plane of the workpiece support (44) and aligned at an angle to one another.

3. A device according to claim 2, characterized in that the deflecting devices (28) are arranged so that both soldering beams (20) can lie, at any time, in their respective resting positions vertically to the plane of the workpiece support (44) and directed obliquely to the plane of a workpiece advancing device.

4. A device according to claims 1, 2 or 3, characterized in that the mirrors (38, 40) can be controlled so that the point of the laser beam on the workpiece (50) performs along the path of movement a fast pendulum (reciprocating) movement within the area of a soldering spot relative to its dwelling time in the area of a soldering spot, and within a predetermined path of movement relative to its speed of movement.

5. A device according to claim 1 characterized by a dimming device (61) that can be connected in the path of the laser beam for a selective weakening of the intensity of the beam and a device for computing the actual points of impact of the soldering beam (20) on the workpiece support (44) and on the workpiece (50), and the control device (48) comprises a device for computing and storage of the control data which correspond to the predetermined points of impact of the soldering beam (20) on the workpiece support (44) and on the workpiece (50).

6. A device according to claim 5, characterized in that the dimming device is arranged within the resonator of the laser (10).

7. A device according to claims 5 or 6, characterized in that the control device (48) comprises a comparator for comparing the respective desired (index) position of the deflecting device of the predetermined control data, as well as a calculating register by which the stored control data can be corrected depending on a deviation between the desired and the actual position.

* * * * *